United States Patent [19]

Felten et al.

[11] Patent Number: 5,306,756
[45] Date of Patent: Apr. 26, 1994

[54] METHOD AND COMPOSITIONS FOR DIFFUSION PATTERNING

[75] Inventors: John J. Felten, Chapel Hill, N.C.; Sheau-Hwa Ma, Chadds Ford, Pa.

[73] Assignee: E. I. Du Pont de Nemours and Company, Wilmington, Del.

[21] Appl. No.: 978,472

[22] Filed: Nov. 18, 1992

Related U.S. Application Data

[62] Division of Ser. No. 768,504, Sep. 30, 1991, Pat. No. 5,209,814.

[51] Int. Cl.$^5$ .............................................. C08K 5/12
[52] U.S. Cl. ................................. 524/297; 524/141; 524/158; 524/169; 524/296; 524/376; 524/378; 524/383; 524/556
[58] Field of Search ............... 524/296, 297, 141, 376, 524/378, 383, 169, 158, 556

[56] References Cited

U.S. PATENT DOCUMENTS

| | | | |
|---|---|---|---|
| 4,093,097 | 6/1978 | Wszolek | 524/556 |
| 4,093,098 | 6/1978 | Wszolek | 524/556 |
| 4,195,169 | 3/1980 | Priddy | 524/556 |
| 4,289,668 | 9/1981 | Li | 524/556 |
| 4,613,639 | 9/1986 | Blum et al. | 524/556 |
| 4,912,160 | 3/1990 | Shalati | 524/376 |
| 5,032,216 | 7/1991 | Felten | 156/628 |

FOREIGN PATENT DOCUMENTS

| | | | |
|---|---|---|---|
| 0361461 | 4/1990 | European Pat. Off. | H05K 1/03 |
| WO91/06118 | 2/1991 | PCT Int'l Appl. | H01L 21/70 |

OTHER PUBLICATIONS

Nishizawa et al., "New Screen-Printable Polyimide for IC Devices," May 20, 1990, pp. 711–716, 1990 Proceedings 40th Electronics Components and Technology Conference.

Primary Examiner—Veronica P. Hoke

[57] ABSTRACT

Method for patterning organic polymer layers comprising the sequential steps:

A. Applying to a substrate an unpatterned layer of acidic polymer dissolved in a plasticizer,
B. Applying to the unpatterned layer a second patterned layer which is a liquid solution of organic base dissolved in a volatile solvent;
C. Heating the patterned layer to effect removal of the volatile solvent from the layer and diffusion of the second layer plasticizer and organic base into the underlying areas of the acidic polymer layer; and
D. Washing the layers with aqueous solution to effect solubilization of the acidic polymer underlying the patterned areas and removal therefrom of the solubilized polymer and plasticizers.

6 Claims, 1 Drawing Sheet

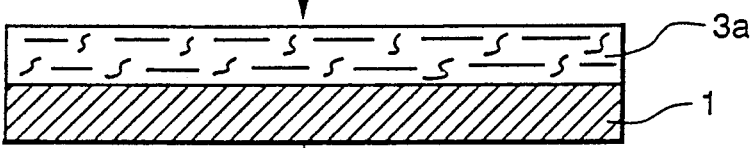
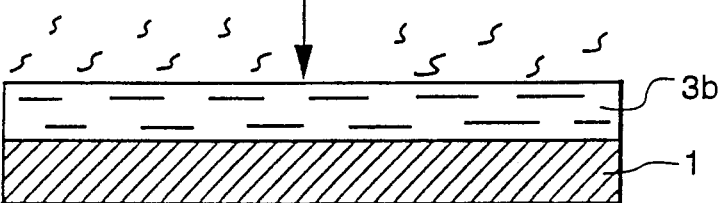
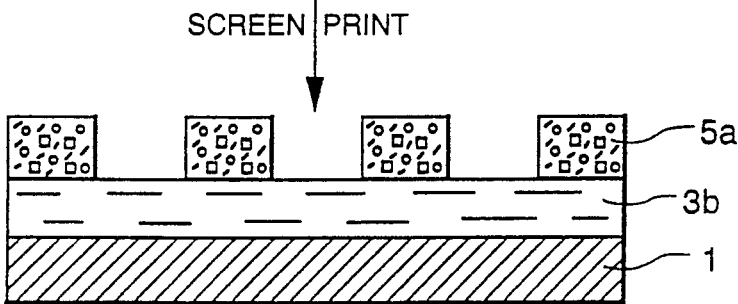
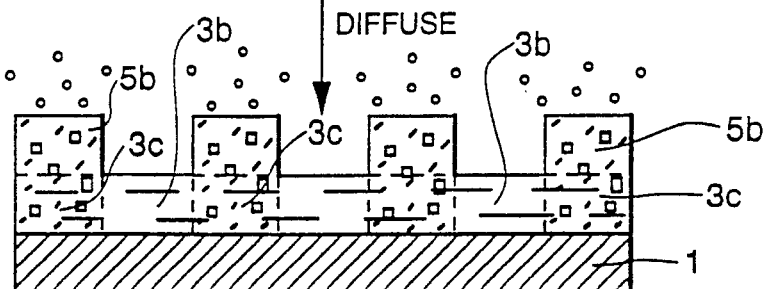
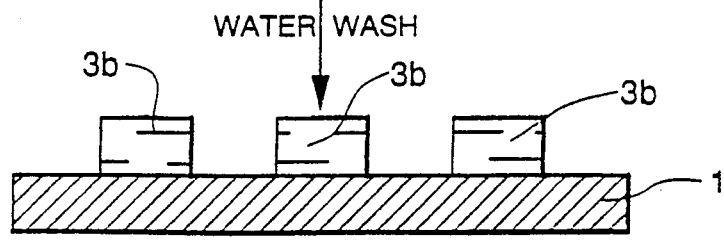

METHOD AND COMPOSITIONS FOR DIFFUSION PATTERNING

This is a division of application Ser. No. 07/768,504, filed Sep. 30, 1991 now U.S. Pat. No. 5,209,814 issued May 11, 1993.

FIELD OF INVENTION

The invention is directed to a method for diffusion patterning of organic polymer films and to polymeric compositions which are especially suitable for patterning by that method.

BACKGROUND OF INVENTION

Thick film technology has historically been an attractive method of producing conductors, dielectrics and resistors that are rugged and reliable. The technology is well suited for economical production of short production runs. Its ability to be patterned in multilayer configurations has allowed fabrication of devices with namely high circuit density. The successive levels of conductors in the multilayer structure are separated by insulating dielectric layers and are interconnected by vias through the dielectric layers.

The multilayer approach is more expensive than a single layer approach because it requires painstaking inspection, realignment between the layers, and careful processing to avoid blistering and cracking.

The most obvious way to reduce these problems associated with multilayer production is to reduce line and space dimensions, thereby reducing the number of layers in a given structure. The problem with this approach has been the limited resolution capability of thick film screen printing, which limits the size of vias used to connect layers of circuitry to 10 to 15 mils diameter. Likewise, conductors are limited to a narrowest line width and spacing of 5 to 7 mil lines and spaces in production quantities.

Many different approaches have been tried to obtain finer pitch lines and smaller vias. Extremely fine screen mesh and improved emulsion backing have allowed line resolution of as low as four mils line/space to be obtained in limited production. Photoformable pastes have been developed that allow five mil or finer vias, and two to three mil line/space pitch. Thick film metallizations have also been patterned with photoresists and etched to produce fine line patterns and thin film conductors have been plated up to produce fine line patterns with high conductivity.

All the above approaches have associated drawbacks. For example, fine mesh screens typically lay down thinner conductor and dielectric layers than are desirable. Photoformable pastes have a larger amount of organic matter that increases shrinkage during firing and can produce dirty burnout that may render fired parts useless. Conductors produced with photoformable pastes have an undesirable edge curl that can reduce the reliability of circuits fabricated with them. The processes that require etch, photoresists or plating are lengthy, process-sensitive and expensive. Furthermore, some of the processes use solvent that is difficult to handle. Accordingly, the need continues for a fast, environmentally safe method for making high resolution images in polymer films, and particularly in thick films, that avoids the above mentioned problems.

SUMMARY OF INVENTION

In a first aspect, the invention is directed to a method for making high resolution images on polymer-containing films comprising the sequential steps of:
  A. Applying to a substrate an unpatterned first layer comprising a solid dispersion of solid acidic organic polymer having an acid number of 20–600 in a first plasticizer;
  B. Applying to the unpatterned first layer a patterned second layer comprising a liquid solution of organic base and volatile solvent;
  C. Heating the patterned second layer to effect removal of the volatile solvent from the layer and diffusion of the organic base into the underlying areas of the first layer whereby the acidic polymer in the underlying areas of the first layer becomes solubilized by reaction with the organic base; and
  D. Washing the layers with aqueous solution having a pH of 5–8.5 to remove the solubilized acidic polymer and plasticizers from the patterned areas of the layers.

In a second aspect, the invention is directed to a thick film dielectric composition for use as the unpatterned first layer in a diffusion patterning process comprising
  A. finely divided particles of inorganic dielectric solids dispersed in
  B. a liquid organic medium comprising a solution of
    (1) film-forming acidic polymer having an acid number of 20–600,
    (2) plasticizer in which the acidic polymer is incompletely soluble; and
    (3) volatile organic solvent, the ratio of polymer to plasticizer being such that, when the volatile organic solvent is removed from the organic medium, the resulting solvent-free polymer/plasticizer dispersion is specularly nonreflective.

BRIEF DESCRIPTION OF THE DRAWING

The Drawing consists of a single FIGURE which illustrates schematically the separate steps of the invention when it is used to pattern a thick film paste.

DETAILED DESCRIPTION OF THE INVENTION

A. Definitions

As used herein the following terms have the indicated meanings:

The term "eluant" refers to any fluid, either liquid or gaseous, which is capable of dissolving or otherwise placing the underlying unpatterned layer into a dispersible form. As applied to the invention, the eluant is aqueous.

The term "dispersible" means with respect to a film of given material that the material is capable of displacement or removal by physical and/or chemical action of a wash liquid. As applied to the invention, the wash liquid is aqueous.

The term "volatile solvent" refers to liquid organic solvents which can be removed from the unpatterned first layer by heating to 120 C. or less at atmospheric pressure.

The term "non-crystalline polymer" refers to solid organic polymers having no more than about 50% crystallinity.

The term "acidic polymer" refers to solid organic polymers having an acid number of 20–600.

The term "solvent free" refers to compositions from which volatile solvent has been removed substantially completely, i.e. any residual amount of solvent is less than about 1% by weight of the remaining composition.

The terms "acrylate" and "acrylic" as used herein to describe monomers and polymers made therefrom include methacrylates as well as acrylates.

All proportions are by weight unless it is otherwise indicated.

B. Detailed Description of the Drawing

The diffusion patterning process can more easily be appreciated by reference to the Drawing, which illustrates schematically the separate steps of the process as it is applied to the patterning of thick film dielectric paste.

A layer of thick film dielectric paste 3a is applied by screen printing to alumina substrate 1. The thick film paste is comprised of finely divided particles of glass dispersed in an organic medium comprising a copolymer of an ethylenically unsaturated carboxylic acid and an acrylate having an acid number of 50 dissolved in dibutyl phthalate plasticizer and terpineol. After printing the layer 3a, the terpineol is removed by heating the layer to a temperature of 80 C. for a period of about 10 minutes.

A patterned second layer 5a is screen printed over the solvent-free thick film layer 3b, the second layer is a viscous liquid comprised of ethyl cellulose binder dissolved in triethanolamine (TEA), dibutyl phthalate and terpineol.

Upon forming the patterned layer 5a, the assemblage is heated to 90 C. during which the terpineol is evaporated from the layer and the triethanolamine and dibutyl phthalate are diffused into the underlying areas of thick film dielectric layer 3b where the triethanolamine reacts with the acid groups of the polymer to render it water dispersible.

After diffusion is completed, the patterned layer 5b consists mainly of ethyl cellulose and small amounts of residual triethanolamine and dibutyl phthalate. It is then washed with water having a pH of 6 to remove the remaining components of the layer and to remove the soluble materials in the imaged areas of thick film layer 3b. Upon completion of the washing, the surface of substrate 1 is exposed in the areas which underlay the pattern of layer 3c and a very precise negative image of the pattern remains on the surface of substrate 1.

C. Substrate

The method of the invention can be used on either inorganic substrates, such as $Al_2O_3$, $SiO_2$, silicon, AlN and the like, or organic substrates, such as polyimides, phenoxy resins, epoxy resins and the like, or composite substrates such as filled organic polymers. When the method of the invention is used for making thick film layers, upon completion of the washing step, the patterned thick film layer is fired to burn off the organic constituents of the layer and to effect densification or sintering of the finely divided solid particles.

D. Acidic Polymer

The binder component of the unpatterned first layer, irrespective of the manner in which it is applied, must be film forming, non-crystalline and must contain a sufficient number of free acid groups that it has an acid number of 20-600. So long as the polymer is acidic to that extent, it will become dispersible when it is exposed to the action of the diffused organic basic compound from the patterned layer. While the molecular weight or glass transition temperature ($T_g$) of the polymer is not of itself critical, it is preferred that the $T_g$ be at least 50 C. and preferably 70 C. or higher in order that less of the polymer can be used in the layer. Non-crystallinity of the acidic polymer is essential in order to facilitate diffusion of both the plasticizer and the liquid base solution from the patterned layer into the thick film layer. So long as they meet the above three criteria, a wide variety of acidic polymers can be used as the binder material for the unpatterned first layer of the invention.

A primary function of the unpatterned first layer is to serve as a dielectric for multilayer electronic circuits. When the dielectric layers of the multilayer are themselves organic, the polymer itself serves the dielectric function. But when the layer is a thick film, the polymer serves as binder for the dielectric solid particles until the layer is fired.

The purpose of the acid moieties on the polymer molecule is to make the areas of the dielectric layer which underlie the pattern dispersible by reaction with aqueous basic solutions which are diffused into the polymer from the patterned layer. As mentioned hereinabove, it is necessary that the number of these acid groups be sufficient to make the polymer dispersible in water upon exposure to the basic liquid from the patterned layer. It has been found that an acid number of 20 is sufficient for this purpose. However, it is essential that the polymer not be water dispersible before the base reaction. Therefore, the acid number of the polymer should not exceed about 600. It is preferred that the acidic polymer have an acid number of 100-300.

As will be discussed in more detail hereinbelow, it is essential that the acidic polymer be substantially soluble in the plasticizer used in the unpatterned layer. Nevertheless, it is preferred that the polymer not be soluble in all proportions. Though the method of the invention can with difficulty be carried out with an homogeneous polymer layer, it is nevertheless preferred that the polymer be present with the plasticizer as a two-phase system. The interface between the phases serves as a path which facilitates diffusion of the basic solution from the patterned layer and contact with the acidic polymer.

The formation of a two-phase system between the polymer and plasticizer upon solvent removal can easily be observed from the gloss characteristics of the surface of the resultant polymer/plasticizer film. If the film is homogeneous, it will be specularly reflective, i.e. it will have a glossy appearance. On the other hand, if it is in the desired two-phase state, the film will be specularly non-reflective, i.e. it will have a dull, satin or matte surface. In order properly to observe specular reflectivity it is necessary to remove any plasticizer or other liquid which may have migrated to the surface.

A wide variety of acid-containing polymers and copolymers can be used in the invention, such as acrylic polymers, styrene acrylic copolymers, vinyl addition polymers, styrene maleic anhydride copolymers, cellulose derivatives. Likewise, the exact chemical composition of the acid moiety of the acidic polymer is not critical. However, the polymers most frequently used will be copolymers of an ethylenically unsaturated acid such as acrylic acid, fumaric acid, vinyl sulfonic acid, itaconic acid, methacrylic acid, crotonic acid and the like. The chemical nature of the polymer backbone is not of itself important so long as the polymer is (1) non-crystalline, (2) film-forming, (3) contains enough acidic groups so that it will undergo ionization upon exposure to basic solutions, and (4) is capable of forming a two-phase system with the plasticizer in the patterning layer. Within these criteria, the choice of polymers will be well within the skill of the known polymer art.

Though it is not necessary to do so, it will be realized that mixtures of acidic and non-acidic polymers can be used as binder for the unpatterned layer if it is desired to obtain special properties not otherwise obtainable from the acidic polymer by itself. However, the acid content of the polymer blend must still be sufficient to render the whole layer dispersible upon exposure to the diffused base solution. For example, it may in some instances be advantageous to use a mixture of acid-containing polymer with another acid-containing polymer or a non-acid containing polymer which has limited compatibility with the first acid-containing polymer to control the phase structure of the polymer film that is to be patterned. As a result, the base solution from the patterned layer can be more effectively diffused into the lower layer to attack the regions that are rich in acid functions and disperse these regions, thereby causing the film structure to collapse rapidly and become readily dispersible within the imaged areas.

A few of the many acidic polymers which can be used in the invention are listed in Table 1 below:

TABLE 1

Composition and Properties of Acidic Polymers

| Composition | Acid No. | M. Wt. |
|---|---|---|
| Poly(vinyl acetate) | 26 | 30,000 |
| Vinyl acetate/crotonic acid copolymer (95/5) | 36 | 30,000 |
| Cellulose acetate succinate | 136 | 30,000 |
| Ethyl acrylate/methyl methacrylate/ acrylic acid copolymer (56/37/7) | 76–85 | 260,000 |
| Vinyl acid/crotonic acid/benzophenone copolymer | 77 | 50,000 |
| Vinyl chloride/vinyl acetate/maleic acid copolymer (81/17/2) | 26 | — |
| Fumaric acid, modified rosin ester | 110–130 | — |
| Styrene/maleic anhydride, partially esterified (50/50) | 320 | 50,000 |
| Styrene/maleic anhydride, non-esterified (50/50) | 480 | 1,600 |
| Styrene/maleic anhydride, non-esterified (67/33) | 350 | 1,700 |
| Methyl methacrylate/methacrylic acid copolymer (92/8) | 59 | 70,000 |
| Methyl methacrylate/ethyl acrylate/ methacrylic acid copolymer (77/15/8) | 50 | 100,000 |
| Alkali-soluble thermoplastic resin-modified aliphatic polyester resin | 130 | — |
| Methyl methacrylate/methacrylic acid copolymer (82/7) | 119 | — |
| Methyl methacrylate/ethyl acrylate/ acrylic acid copolymer (37/56/7) | 80 | 200,000 |
| Acrylic acid/alpha methyl styrene/ styrene copolymer | 197 | 2,810 |

These acid-containing polymers can be prepared by any of the conventional polymerization techniques known to those skilled in the art, which include solution polymerization, bulk polymerization, bead polymerization, emulsion polymerization, etc., in the presence of a free radical generating polymerization initiator, such as peroxy compounds.

E. Plasticizers

Both the unpatterned layer and the patterned layer preferably contain substantial amount of plasticizers in which the polymer component of the unpatterned layer is at least partially soluble. The primary function of the plasticizer in both layers is to facilitate diffusion of the base liquid from the patterning layer into the underlying areas of the unpatterned layer. While it is not absolutely necessary to have plasticizer in both layers, it is nevertheless preferred because it gives greater imaging sensitivity. The plasticizers in the two layers may be the same or different so long as they meet the particular criteria for the layers. The plasticizer in the lower unpatterned layer must (1) be capable of dissolving the polymer in the unpatterned layer, and (2) preferably capable of forming a solid two-phase system with the acidic polymer in the unpatterned layer. On the other hand, the plasticizer in the patterned layer must be a solvent for the binder polymer in the patterned layer, for the acidic polymer in the unpatterned layer, and for the organic base.

The amount of plasticizer used in the layers varies widely depending upon the polymer which is used. As was mentioned hereinabove, it is preferred to maximize the amount of plasticizer in the unpatterned layer to minimize the amount of polymer which must be burned off when the layers are thick film pastes. It is preferred that the boiling points of the plasticizers be at least 250 C. in order that they remain in the layer as the volatile solvent is driven off by heating. Nevertheless, it is further preferred that the volatility of the plasticizers be such that they can be removed from the system by simple heating if it is desired to reduce the amount of plasticizer. In fact this technique may in some instances be preferred since the removal of plasticizer in this manner leaves holes in the unpatterned film that facilitate diffusion of plasticizer from the patterned layer.

A wide range of plasticizers can be used to facilitate the penetration of the base into the polymer film that is to be patterned and to adjust the film properties. A plasticizer would be selected which shows reasonable compatibility with the binder and other components of the layers. With acrylic binders, for example, plasticizers can include dibutyl phthalate and other esters of aromatic acids; esters of aliphatic polyacids such as diisooctyl adipate, and nitrate esters; aromatic or aliphatic acid esters of glycols, polyoxyalkylene glycols, aliphatic polyols; alkyl and aryl phosphates; chlorinated paraffins; and sulfonamide types can be used.

In general, water insoluble plasticizers are preferred for greater high humidity storage stability and environmental operating latitude, but are not required. Suitable plasticizers include: triethylene glycol, triethylene glycol diacetate, triethylene glycol diproprionate, triethylene glycol dicaprylate, triethylene glycol dimethyl ether, triethylene glycol bis(2-ethylhexonate), tetraethylene glycol diheptanoate, poly(ethylene glycol), poly(ethylene glycol) methyl ether, isopropyl naphthalene, diisopropyl naphthalene, poly(propylene glycol), glyceryl tributyrate, diethyl adipate, diethyl sebacate, dibutyl suberate, tributyl phosphate, tris (2-ethylhexyl) phosphate, t-butylphenyl diphenyl phosphate, triacetin, dioctyl phthalate, $C_{12}H_{25}(OCH_2CH_2)_2OH$, tris(2-butoxyethyl) phosphate and phthalates such as dicyclohexyl phthalate, dioctyl phthalate, diphenyl phthalate, diundecyl phthalate, butyl benzyl phthalate, 2-ethylhexyl benzyl phthalate.

F. Solids Components

It should be recognized that the method of the invention can be used to image organic layers alone as well as thick film and other filled layers. When the method is used for thick films, the solids component of the unpatterned layer will generally be a dielectric material, such as glass or a mixture of glass-forming oxides, which will densify and/or sinter when they are fired at, for example, 800-950 C. The chemical composition of the solids is not by itself important with respect to application of the invention so long as they are inert to the components of the organic medium.

The use of solids in the patterned layer is not always necessary. Nevertheless, the use of finely divided solids is a very useful way of obtaining appropriate rheological properties of the layer for printing and subsequent processing in accordance with the invention. The composition of the solids in the patterned layer is not otherwise important since they are physically removed from the system by washing after completion of the diffusion patterning step.

The particle size of the solids is also uncritical. However, it should ordinarily be in the range of 0.5-20 microns in order to be useful for application by screen printing.

G. Patterned Layer Polymer

The primary function of the binder polymer in the patterning layer is to adjust the rheology of the layer consistent with the way it is applied to the unpatterned layer. Therefore, it is not an essential component of the patterned layer in every instance. For example, it is not needed when the layer is applied by ink jet printing. However, when the patterning layer is applied as a thick film paste, the polymer serves both to adjust the rheology of the paste and as a binder for the finely divided solids until they are removed in the washing step.

The nature of the binder polymer is not critical within broad limits so long as the rheological properties of the patterning layer are appropriate for the method of application. However, when the patterned layer is applied as a thick film paste, it is strongly preferred to use cellulosic polymers such as ethyl cellulose as the binder because of its water solubility and its very desirable thixotropic properties.

H. Organic Base

It is preferred that the basic component of the patterning layer be an organic base which is compatible with and preferably soluble in the plasticizer. The base can be either liquid or solid. When solid bases are used it is preferred that the melting points not exceed 120 C. Such materials include organic amines such as alkyl amines, aromatic amines such as pyridine, morpholine and alkanol amines such as triethanolamine.

The amount of base in the patterning layer must be sufficient to provide a solubilizing effect by diffusion into the underlying first layer.

The diffusion patterned areas need to be dispersed with an aqueous solution in the pH range of 5-8.5. Water is preferred. If necessary, the resulting aqueous solution may contain a low level of a base, preferably the same base used in the patterning step to help reach the critical concentration and make the imaged areas dispersible without deleteriously affecting the unimaged areas. It is preferred that the wash solution pH be at least 5 in order to avoid excessive neutralization of the diffused base. On the other hand, the pH should not be greater than 8.5 in order to avoid solubilization of non-imaged areas. Optionally, low levels of water soluble surfactants may be present in the wash solution to facilitate the interaction between the base and the acidic polymer film.

I. Formulation and Application

The method of the invention is intended primarily for use as a functional layer in the fabrication of electronic components. Typically the patterned layer which contains dispersibility-changing agent (organic base) will range from 1 to 30 microns thickness while the first layer can be of much greater thickness, from 10 to 100 microns. The thickness of the patterned layer is limited chiefly by the method of application, rather than by considerations of operability.

By and large, the individual steps for preparation of the component layers for the method of the invention are similar to those which are known by those skilled in the art of conventional thick film pastes.

J. Alternative Patterning Methods

It is preferred to carry out the diffusion patterning method of the invention by screen printing the patterning layer. Nevertheless, that step can be carried out by other methods as well. Such methods include thermal transfer, electrophotography, pen plotters and ink jet printing.

Thermal Transfer: The dispersibility changing agents can be formulated with polymeric binders and other necessary additives to make a hot melt ink composition as practiced by those skilled in the art. The ink composition containing the base is precoated on a dimensionally stable thin base, e.g., PET film. The ink ribbon is placed in close contact with the thick film substrate with the ink facing the thick film composition. Through the base side of the ink ribbon, a thermal head similar to those used in commercially available computer printers is used to imagewise affect the transfer of the ink composition into the thick film substrate. If the ribbon formulation and the heating conditions are adjusted properly, the heat used to generate the pattern may be adequate to affect the diffusion of the active ingredients into the thick film composition and change its dispersibility behavior simultaneously. The element is then processed as previously described.

Alternatively, the patterning can be affected by an IR laser if an IR absorbing material such as carbon black, graphite or organic dyes which is very efficient in converting the IR radiation into heat is added to the formulation. The heat generated in this manner will induce the transfer of the active ingredients into the thick film substrate.

Typically, the waxy and water-repelling type of binder materials are used in formulating the hot melt inks. If the process is changed slightly, instead of diffusing the ink into the thick film composition, the ink is overprinted on an aqueously developable organic compound containing composition. The water resistant image can be used as a mask or resist for the subsequent aqueous processing for a positive mode operation.

Electrophotography: The dispersibility changing agents can be formulated with polymeric binders, charge directors and adjuvants to make toner particles which may be dispersed in a liquid carrier medium as practiced by those skilled in the art. The toner particles are imagewise applied to the thick film substrate through the various mechanisms that are familiar to those skilled in the art. At the fusing step, the active ingredients are driven into the thick film composition to affect the dispersibility change for a predetermined solvent system.

Pen Plotters: The dispersibility changing agents are formulated with additives in a water- or solvent-based liquid vehicle. The pattern is generated with a pen through digital commands as in a commercially available plotter. The active ingredients are driven into the thick film composition to affect the desired solubility change. The aqueous ink system is the preferred mode of operation for environmental reasons.

Ink Jet, Liquid Ink: The dispersibility changing agent is formulated with additives in a water- or solvent-based liquid vehicle as practiced by those skilled in the art. The images are generated with an ink jet printhead similar to those found in commercially available computer printers. The liquid vehicle and/or additives such as plasticizers and surfactants can be used to carry the active ingredients into the thick film composition to effect the solubility change. The use of water-based ink is the preferred mode of operation for environmental reasons.

Ink Jet, Solid Ink: The dispersibility changing agents can be formulated with solid vehicle that melts at an elevated temperature. During printing, the ink droplets are ejected in its melted form according to the digital commands as in those commercially available computer printers to give high resolution images on the thick film composition. Diffusion of the active ingredients into the thick film composition changes the dispersibility in the imaged areas.

The waxy ink composition as often used in this type of application can also be used as a mask or resist in the same fashion as described in the thermal transfer method for an aqueously developable organic compound containing composition in a positive mode of operation.

The invention will be further illustrated by the following examples:

EXAMPLES

EXAMPLE 1

A dielectric thick film element was prepared using the following compositions and procedures:

| Dielectric Solids: | |
| --- | --- |
| Component | % Wt. |
| Glass A | 47.36 |
| Glass B | 31.57 |
| Alumina | 6.55 |
| Zirconium Silicate | 8.76 |
| Cobalt Aluminate | 3.00 |
| Titanium Oxide | 2.76 |

| Composition | Glass A % Wt. | Glass B % Wt. |
| --- | --- | --- |
| BaO | 12.56 | 11.78 |
| SrO | 10.82 | 10.15 |
| CaO | 6.70 | — |
| ZnO | 16.0 | 21.29 |
| $Al_2O_3$ | 5.50 | 6.90 |
| $SiO_2$ | 46.01 | 47.64 |
| $ZeO_2$ | 2.40 | 2.42 |

| Paste Composition: | |
| --- | --- |
| Ingredient | Amount % Wt. |
| Dielectric Solids | 60.0 |
| Elvacite 2010 | 2.1 |
| Carboset XPD-1234 | 6.2 |
| Butyl Benzyl Phthalate | 11.2 |
| Tergitol TMN-6 | 2.1 |
| Terpineol | 18.4 |

The above paste compositions were prepared in the manner familiar to those skilled in formulation of thick film materials and were prepared for printing as follows:

The materials were processed by printing the dielectric optionally one, two or three prints, with each print followed by drying 10 to 15 minutes at 80 to 90 degrees Celsius. A two-phase system was formed upon solvent removal.

| Printing Ink: | |
| --- | --- |
| Ingredient | Amount % Wt. |
| Triethanolamine (Fisher Scientific Co., Pittsburg PA) | 30 |
| Butyl Carbitol (Aldrich Chem. Co., Milwaukee WI) | 10 |
| Deionized Water | 60 |
| | 100 |

The above mentioned components were mixed and stirred to give a homogeneous solution. The resulting solution was used as printing ink to generate single dot pattern on the dielectric coating using a Hewlett Packard Desk Jet ink jet printer (Hewlett Packard, Palo Alto, Calif.). The imaged element was baked at 75 C in an oven for 5 min. It was then immersed in warm water at 60 C. with ultrasonic agitation for 1 min. 130 micron wide and 26 micron deep vias with perfectly round shape and straight walls were obtained.

EXAMPLE 2

A printing ink was prepared using the following procedure:

| Printing Ink: | |
| --- | --- |
| Ingredient | Amount % Wt. |
| Triethanolamine (Fisher Scientific Co., Pittsburg PA) | 30 |
| Merpol SH (E. I. du Pont Co., Wilmington DE) | 1.0 |
| Deionized Water | 69 |
| | 100 |

The above mentioned components were mixed and stirred to give a homogeneous solution. The resulting solution was used as printing ink to generate a single dot pattern on the dielectric thick film described in Example 1. The imaged element was baked at 75 C. in an oven for 5 minutes. It was then immersed in warm water at 60 C. with ultrasonic agitation for 1 minute. 130 micron wide and 24 micron deep vias with perfectly round shape and good edge definition were obtained.

EXAMPLE 3

A dielectric thick coating was prepared using the following procedure:

| Ingredient | Amount % Wt. |
| --- | --- |
| Dielectric Solids (as in Example 1) | 58.25 |
| Elvacite 2051 | 1.01 |
| Carboset XPD-1234 | 9.08 |
| Butyl Benzyl Phthalate | 16.51 |
| Terpineol | 15.13 |
|  | 100.0 |

The above mentioned paste composition was prepared and printed on the alumina substrate as described in Example 1.

A printing ink was prepared using the following procedure:

| Ingredient | Amount % Wt. |
| --- | --- |
| Triethanolamine (Fisher Scientific Co., Pittsburg PA) | 30 |
| Acetic Acid (EM Science, Gibbstown NJ) | 6.7 |
| Deionized Water | 63.3 |
|  | 100 |

Triethanolamine was dissolved in deionized water. Acetic acid was slowly added with agitation. The resulting solution having a pH of 8.5 was used as printing ink to generate the single dot pattern on the dielectric thick film using a Hewlett Packard DeskJet printer (Hewlett Packard, Palo Alto Calif.). The imaged element was heated from the back side at about 200 C. for 3 sec on, followed by baking at 75 C. in an oven for 5 min. It was then immersed in warm water at 60 C. with ultrasonic agitation for 1 min. 160 micron wide and 29 micron deep vias with very round shape and sharp definition were obtained.

EXAMPLE 4

Dielectric paste and patterning paste having the following compositions were screen printed on the substrate described in Example 1 using techniques known to one skilled in the art.

The dielectric vehicle had the following composition:

| Ingredient | Amount % Wt. |
| --- | --- |
| Poly(methyl methacrylate) | 2 |
| Methyl Methacrylate/Methacrylic Acid Copolymer | 18 |
| Butyl Benzyl Phthalate | 42 |
| Terpineol | 38 |

The dielectric paste had the following composition:

| Ingredient | Amount % Wt. |
| --- | --- |
| Inorganic Solids | 64 |
| Dielectric Paste Vehicle | 36 |

The patterning paste vehicle had the following composition:

| Ingredient | Amount % Wt. |
| --- | --- |
| Ethyl Cellulose | 4 |
| Triethanolamine | 42 |
| Terpineol | 27 |
| Butyl Benzyl Phthalate | 27 |

The patterning paste had the following composition:

| Ingredient | Amount % Wt. |
| --- | --- |
| 0.45 Micron Alumina | 63.5 |
| Patterning Paste Vehicle | 38.5 |

The patterning layer was then printed by using a via fill screen with several sizes of via openings. The patterning paste was then dried at 80 to 100 C. for 5 to 10 min. Uniform, well defined vias with steep side walls were produced. Average size was 4–5 mils, dielectric film thickness was in excess of 30 microns.

GLOSSARY

Carbitol: Trademark of Union Carbide Corp., Danbury, Conn. for diethylene glycol ethyl ethers.

Carboset XPD-1234: Trademark of B. F. Goodrich & Co., Cleveland, Ohio for acidic methylmethacrylate copolymers.

Elvacite 2051: Trademark of E. I. du Pont de Nemours and Co., Wilmington, Del. for methyl methacrylate resins.

Merpol SH: Trademark of E. I. du Pont de Nemours and Co., Wilmington, Del. for non-ionic esters of ethylene oxide.

Santicizer S-160: Trademark of Monsanto Chemical Co., St. Louis, Mo., for N-alkyl-paratoluenesulfonamide plasticizers.

Tergitol TMN-6: Trademark of Union Carbide Corp., Danbury, Conn. for non-ionic surfactants.

We claim:

1. A composition for use as the first unpatterned layer in a diffusion patterning process comprising finely divided particles of inorganic dielectric solids dispersed in a liquid organic medium comprising a solution of a film-forming acidic polymer having an acid number of 20–600; a plasticizer in which the acidic polymer is incompletely soluble; and a volatile organic solvent wherein the ratio of polymer to plasticizer being such that when the volatile organic solvent is removed from the organic medium, the resulting solvent-free polymer/plasticizer dispersion is specularly nonreflective.

2. The composition of claim 1 in which the acidic polymer comprises a minor amount by weight of the solvent-free organic medium.

3. The composition of claim 1 in which the acidic polymer has an acid number of 100–400.

4. The composition of claim 1 in which the acidic polymer is a copolymer of an hydrocarbyl acrylate or methacrylate with an ethylenically unsaturated carboxylic acid.

5. The composition of claim 1 in which the plasticizer is water-insoluble.

6. The composition of claim 1 in which the plasticizer is a glycol.

* * * * *